(12) United States Patent
Riedl et al.

(10) Patent No.: US 7,989,930 B2
(45) Date of Patent: Aug. 2, 2011

(54) SEMICONDUCTOR PACKAGE

(75) Inventors: Edmund Riedl, Gebelkofen (DE);
Joachim Mahler, Regensburg (DE);
Johannes Lodermeyer, Kinding (DE);
Mathias Vaupel, Regensburg (DE);
Steffen Jordan, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 284 days.

(21) Appl. No.: 11/924,134

(22) Filed: Oct. 25, 2007

(65) Prior Publication Data
US 2009/0108423 A1 Apr. 30, 2009

(51) Int. Cl.
*H01L 21/00* (2006.01)
(52) U.S. Cl. ......... 257/666; 257/667; 438/112; 438/123
(58) Field of Classification Search .................. 257/666, 257/667; 438/112, 123
See application file for complete search history.

(56) References Cited

U.S. PATENT DOCUMENTS

| 5,691,567 | A | 11/1997 | Lo et al. |
| 5,960,251 | A | 9/1999 | Brusic et al. |
| 6,614,123 | B2 | 9/2003 | Lee et al. |
| 6,784,536 | B1 | 8/2004 | Eslamy |
| 7,105,383 | B2 | 9/2006 | Vo et al. |
| 2002/0127776 | A1* | 9/2002 | Nakajo et al. ................. 438/110 |
| 2004/0041241 | A1* | 3/2004 | Vo et al. ......................... 257/666 |

FOREIGN PATENT DOCUMENTS

| JP | 61048953 | 3/1986 |
| JP | 06244340 | 9/1994 |
| JP | 09172121 | 6/1997 |
| JP | 2004200349 | 7/2004 |
| JP | 2004200350 | 7/2004 |

OTHER PUBLICATIONS

ENTEK PLUS Process, PWB Copper Protective Coating System, Teamwork Across the Board, Nov. 1993 (1 pg.).

* cited by examiner

*Primary Examiner* — Leonardo Andújar
(74) *Attorney, Agent, or Firm* — Dicke, Billig & Czaja, PLLC

(57) ABSTRACT

A semiconductor package includes a leadframe defining a die pad, a chip electrically coupled to the die pad, encapsulation material covering the chip and the die pad, and a plurality of lead ends exposed relative to the encapsulation material and configured for electrical communication with the chip, and a nitrogen-containing hydrocarbon coating disposed over at least the lead ends of the leadframe, where the hydrocarbon coating is free of metal particles.

22 Claims, 4 Drawing Sheets

SEMICONDUCTOR PACKAGE

BACKGROUND

Integrated circuit chips are conventionally enclosed in a package that provides protection from environmental conditions and enables electrical interconnection between the chip and another electrical component, such as a printed circuit board or a motherboard. A semiconductor package includes a supporting leadframe having leads, a chip electrically coupled to the leadframe, and encapsulating material molded over a surface of the leadframe and the chip. The encapsulating material defines an exterior surface of the package through which the leads are exposed for subsequent electrical connection to printed circuit boards and the like.

The leadframe provides a support structure for the package. When the package is singulated, or severed from its carrier, the leads of the leadframe are exposed. Copper or copper-based leads are known to oxidize in the presence of air. Oxidized leads have reduced or unacceptable electrical properties. Some copper leads are plated by a galvanic process with tin to minimize oxidation of the leads. However, tin is susceptible to the formation of whiskers, or needle-like tendrils, that have the potential to undesirably cause electrical shorts in the finished package. Some copper leads are plated by a galvanic process with an alloy of tin and lead (Pb) to minimize oxidation of the leads. Alloys of lead (Pb) are environmentally undesirable.

For these and other reasons there is a need for the present invention.

SUMMARY

One aspect provides a semiconductor package. The semiconductor package includes a leadframe defining a die pad, a chip electrically coupled to the die pad, encapsulation material covering the chip and the die pad, and a plurality of lead ends exposed relative to the encapsulation material and configured for electrical communication with the chip, and a nitrogen-containing hydrocarbon coating disposed over at least the lead ends of the leadframe, where the hydrocarbon coating is free of metal particles.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise. As employed in this Specification, the term "electrically coupled" is not meant to mean that the elements must be directly coupled together; intervening elements may be provided between the "electrically coupled" elements.

Embodiments provide a semiconductor package including leads having a surface sensitive solution coated on the exposed portions of the leads, where the surface sensitive solution is configured to minimize oxidation of the exposed leads. Embodiments provide a semiconductor package including leads extending from the semiconductor package, where the leads include a surface sensitive solution coated on to the exposed leads of the package.

Embodiments provide a semiconductor package having copper leads and an organic protection coating disposed over the copper leads. Other embodiments provide a leadframe defining a die pad, lead fingers configured to provide electrical connection with a chip coupled to the die pad, and lead ends extending from the leadframe, where the leadframes include a nitrogen-containing hydrocarbon coating disposed over the lead ends of the leadframe. In some embodiments, the organic protection coating is free of metal particles. In some embodiments the organic protection coating is adapted to vaporize from the lead ends at temperatures greater than 180 degrees Celsius.

The organic protection coating disposed over the lead ends is configured to minimize oxidation and oxidative reactions to the copper portions of the lead ends. The organic coating prevents oxidation and degradation of the electrical properties of the lead ends, and thus enables the lead ends to be coupled to a printed circuit board and have high quality electrical connections.

Figure 1:
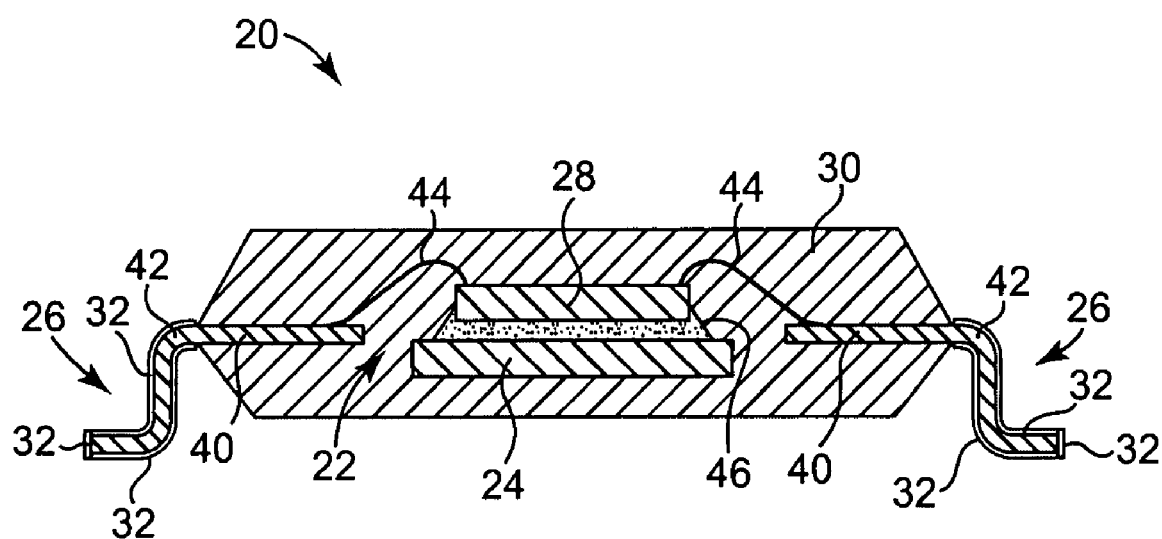
FIG. 1 is a cross-sectional view of a semiconductor package including a hydrocarbon coating disposed on exposed portions of package leads according to one embodiment.

FIG. 1 is a cross-sectional view of a semiconductor package 20 according to one embodiment. Semiconductor package 20 is an electronic device that includes a leadframe 22 defining a die pad 24 and leads 26, a chip 28 electrically coupled to die pad 24, a body 30 of a encapsulating material deposited over die pad 24 and chip 28, and an organic coating 32 disposed over exposed portions of leads 26. In one embodiment, package 20 is a leadless package and leads 26 define pads that are exposed when package 20 is singulated.

In one embodiment, package 20 includes leads 26 that extend from body 30 and include lead fingers 40 and lead ends 42. Lead fingers 40 are configured to be electrically connected with chip 28 by connectors 44. Lead ends 42 extend from body 30 of encapsulating material and are available to electrically couple semiconductor package 20 to other devices such as printed circuit boards and/or motherboards. In another embodiment, leads 26 include lead pads of a leadless package, where the lead pads are exposed when the leadless package is singulated from its frame during fabrication.

In one embodiment, leadframe 22 is a package interposer disposed between an integrated circuit such as chip 28 and a board (not shown) to which package 20 is coupled. In general, leadframe 22 provides a carrier for semiconductor package 20. Suitable carriers include carriers with leads, such as through-hole carriers, dual inline plastic package carriers, gull wing carriers, small outline carriers, quad flat package carriers; and carriers without leads, such as very thin quad flat no lead package carriers and thin small leadless package carriers. In one embodiment, leadframe 22 is a copper leadframe or a leadframe of a copper alloy. In other embodiments, leadframe 22 includes one or more finish layers such as diffusion barriers, adhesion promoters, and the like.

In one embodiment, chip 28 includes a control chip, a logic chip, a vertical high voltage chip, a power transistor chip, a metal oxide semiconductor field effect transistor, or other suitable semiconductor die. In general, chip 28 is attached to die pad 24 by an adhesive or a paste or other suitable attachment material.

Body 30 of encapsulating material includes polymers suited for molding around leadframe 22. In one embodiment, body 30 defines an electrically insulating volume of material that insulates and protects components of semiconductor package 20. Suitable materials for body 30 of encapsulating material include polymers in general, specific examples of which include polycarbonates, thermoplastics, curable resins, molding compounds, blends and mixtures of molding compounds, and/or injection molding compounds.

In one embodiment, organic coating 32 includes an organic protection coating of a nitrogen-containing hydrocarbon that is free of metal particles. In one embodiment, organic coating 32 includes a coating that is adapted to vaporize at temperatures greater than 180 degrees Celsius. In one embodiment, organic coating 32 is adapted to vaporize, i.e., boil off, at temperatures of between about 200-300 degrees Celsius. In one embodiment, organic coating 32 is free of metal particles and is substantially removable from lead ends 42 by a desorption process. In one embodiment, organic coating 32 is a surface sensitive solution in liquid form that adheres to copper and copper-containing surfaces and is free of metal particulates and metal particles.

In general, organic coating 32 includes nitrogen-containing hydrocarbons provided in liquid form that are free of metal particles, configured for deposition on at least the lead ends 42 of leadframe 22, and when dried, are adapted to vaporize and be removed from lead ends 42 at temperatures greater than 180 degrees Celsius.

In one embodiment, organic coating 32 includes imidazole having the structural formula:

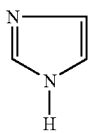

In one embodiment, organic coating 32 includes 4-methylimidazole having the structural formula:

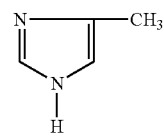

In one embodiment, organic coating 32 includes 4-methyl-5hydroxymethylimidazole having the chemical formula $C_5H_8N_2O$ provided at 112 g/mol with the structural formula:

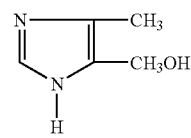

In one embodiment, organic coating 32 includes 1-phenyl-4-methylimidazole having the structural formula:

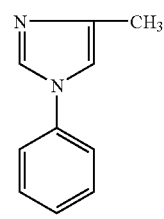

In one embodiment, organic coating 32 includes 1-(p-tolyl)-4-methylimidazole having the structural formula:

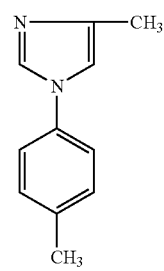

Other imidazoles having other chemical formulas and other structural formulas are also acceptable.

In one embodiment, organic coating 32 includes benzotriazol and benzotriazol derivatives that are provided in liquid form that are free of metal particles, configured for deposition on to at least the lead ends 42 of leadframe 22, and when dried, are adapted to vaporize and be removed from lead ends 42 at temperatures greater than 180 degrees Celsius. One suitable benzotriazol derivative includes the benzotriazol represented by this structural formula:

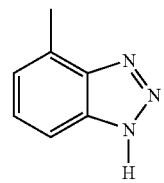

Another suitable benzotriazol derivative includes the benzotriazol represented by this structural formula:

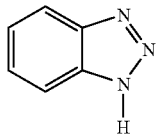

Other benzotriazoles and benzotriazol derivatives having other chemical formulas and other structural formulas are also acceptable.

Organic coating 32 includes various other suitable molecules including amine, diamine, isonitrile, and the like that are provided in liquid form and are free of metal particles, configured for deposition on to at least the lead ends 42 of leadframe 22, and when dried, are adapted to vaporize and be removed from lead ends 42 at temperatures greater than 180 degrees Celsius. Suitable compounds for organic coating 32 include amine having the structural formula:

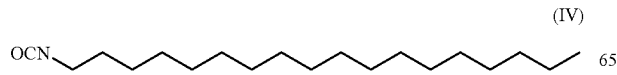
(I)

monoalkylated ethylenediamine having the structural formula:

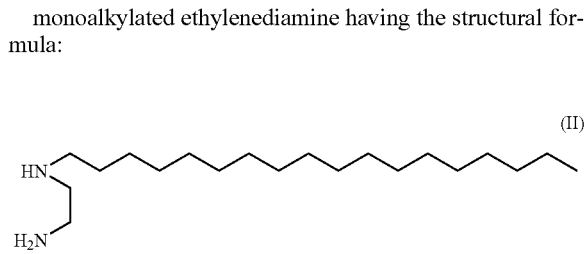
(II)

bisalkylated ethylenediamine having the structural formula:

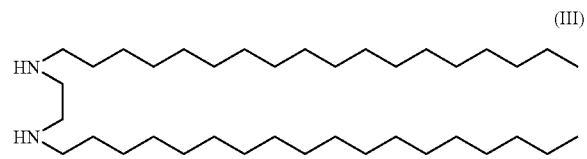
(III)

isocyanate having the structural formula:

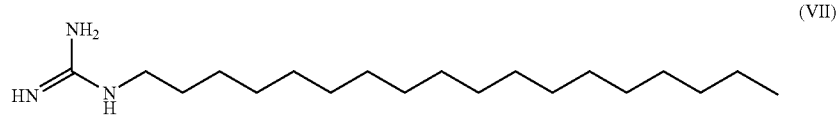
(IV)

nitrile having the structural formula:

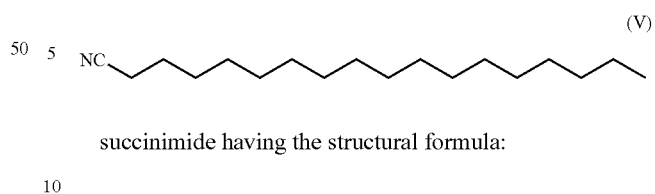
(V)

succinimide having the structural formula:

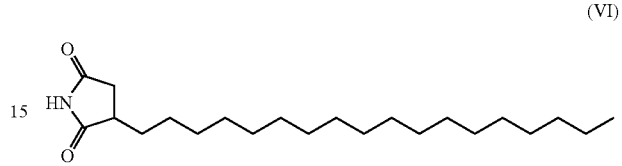
(VI)

guanidine having the structural formula:

(VII)

stearic acid having the structural formula:

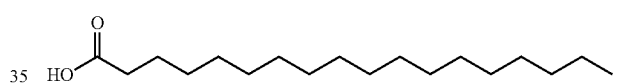
(VIII)

and cationic amine having the structural formula:

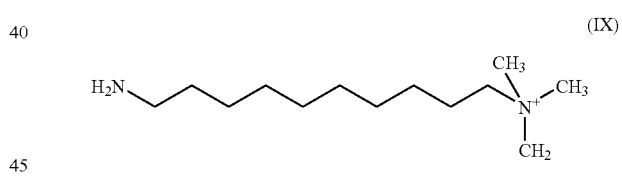
(IX)

In one embodiment, organic coating 32 includes silane provided in liquid form that is free of metal particles, configured for deposition on to at least the lead ends 42 of leadframe 22, and when dried, is adapted to vaporize and be removed from lead ends 42 at temperatures greater than 180 degrees Celsius. In one embodiment, organic coating 32 includes a silane provided in the form of triethoxy (1-phenylethenyl) silane having a boiling point of about 264 degrees Celsius and generally having a thermal desorption temperature of greater than about 260 degrees Celsius.

One suitable Silane is described by the structural formula:

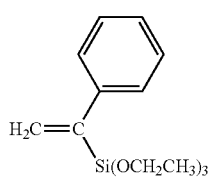

In one embodiment, organic coating 32 includes triethoxy (3-isocyanatopropyl) silane having a boiling point of about 283 degrees Celsius and represented by the chemical formula:

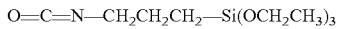

In one embodiment, organic coating 32 includes a (3-aminopropyl)triethoxysilane having a boiling point of about 217 degrees Celsius and represented by the chemical formula:

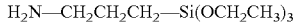

Other silanes having other chemical formulas and other structural formulas are also acceptable.

In one embodiment, organic coating 32 is a nitrogen containing hydrocarbon coating provided in a liquid solution that is substantially free of metal particles. Suitable organic coatings 32 include imidazole, imidazole derivatives, benzotriazol, benzotriazol derivatives, amine, amine derivatives, silane, and silane derivatives.

In one embodiment, organic coating 32 is adapted to be removed from surfaces on to which it is coated by a desorption process. One suitable desorption process is a thermal desorption process conducted at temperatures above 180 degrees Celsius. One suitable range for the thermal desorption process is conducted at temperatures of between about 200-300 degrees Celsius.

One suitable desorption process is a chemical desorption process conducted at generally lower temperatures than the thermal desorption process. One suitable chemical desorption process includes dipping semiconductor package 20 into a hydrocarbon-removing chemical solution.

In general, the desorption behavior of organic coating 32 is configured to be stable to thus prevent the formation of metal oxides and sulfides at higher temperatures, for example, at temperatures above about 180 degrees Celsius.

Figure 2:
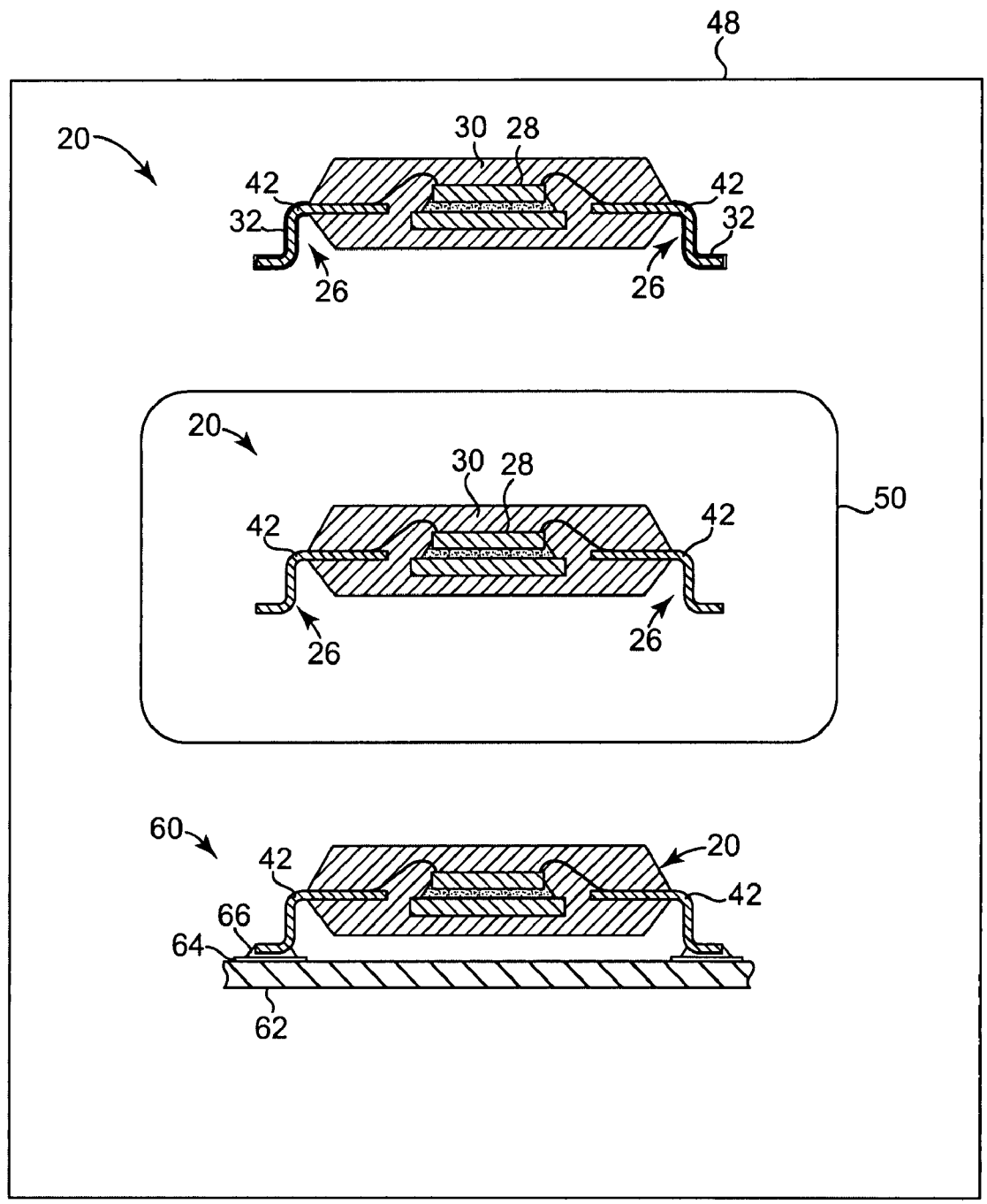
FIG. 2 is a diagram of a process for assembling an electronic device including a semiconductor package attachable to a printed circuit board according to one embodiment.

FIG. 2 is a diagram of a process 48 for assembling an electronic device 60 according to one embodiment. Semiconductor package 20 is provided including organic coating 32 disposed over lead ends 42 of leads 26. For example, semiconductor package 20 includes a finished semiconductor package assembled and delivered to a customer with an organic coating 32 provided to protect and minimize oxidation of lead ends 42.

In one embodiment, semiconductor package 20 is introduced to a desorption stage 50 in which organic coating 32 is removed from lead ends 42. Desorption stage 50 may occur after fabrication/assembly or in the customer facility. For example, in one embodiment organic coating 32 is removed from lead ends 42 in a thermal desorption stage 50. One suitable thermal desorption process for stage 50 includes elevating a temperature of semiconductor package 20 above about 180 degrees Celsius to vaporize organic coating 32 off of lead ends 42. In one embodiment, organic coating 32 is configured to have a low vapor pressure such that organic coating 32 effectively boils off of lead ends 42 when heated above about 180 degrees Celsius.

In another embodiment, desorption stage 50 includes a chemical desorption stage in which organic coating 32 is removed from lead ends by a hydrocarbon remover or cleaner or the like.

In one embodiment, copper lead ends 42 having organic coating 32 removed are coupled to a printed circuit board 62 to define an electronic device 60. In one embodiment, printed circuit board 62 includes motherboards and other electronic boards having a pad 64, where lead ends 42 are electrically coupled to pad 64 by, for example, solder 66. Solder 66 includes pure tin solder and alloys of tin solder that is applied at temperatures of above 180 degrees Celsius. Thus, in one embodiment solder 66 provides a suitable desorption process in which organic coating 32 is removed from lead ends 42 when leads 26 are soldered to board 62.

In this manner, the fabricated lead ends 42 have been protectively coated with organic coating 32 to prevent oxidation until lead ends 42 are ready to be soldered to pads 64 to form electronic device 60. Solder 66 forms a high quality and suitable electrical connection between the copper-containing lead ends 42 and electrical pad 64 on printed circuit board 62.

Figure 3:
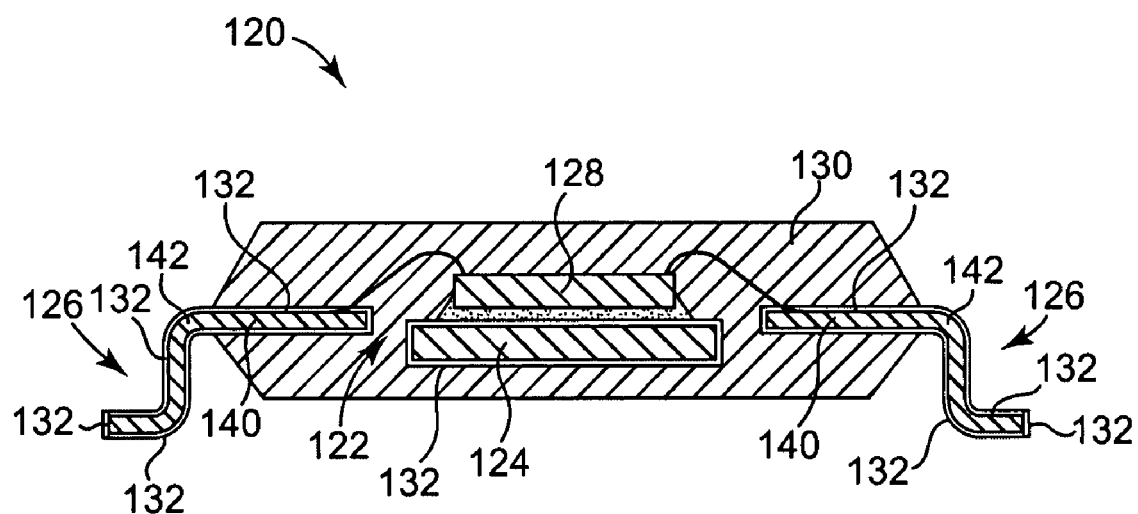
FIG. 3 is a cross-sectional view of a semiconductor package including a hydrocarbon coating disposed over an entirety of a leadframe of the package according to one embodiment.

FIG. 3 is a cross-sectional view of a semiconductor package 120 according to one embodiment. Semiconductor package 120 includes a leadframe 122 defining a die pad 124 and leads 126, a chip 128 electrically coupled to die pad 124, a body 130 of a encapsulating material deposited over die pad 124 and chip 128, and an organic coating 132 disposed over an entirety of leadframe 122 such that die pad 124 and leads 126 are coated with an anti-oxidation layer. Chip 128, body 130 of encapsulating material, and organic coating 132 are similar to the chip 28, body 30, and coating 32 described above in FIG. 1.

In one embodiment, leads 126 include lead fingers 140 and lead ends 142. Lead fingers 140 are electrically connected with chip 128 by connectors, such as wire connectors as illustrated. Lead ends 142 extend from body 130 of encapsulating material and are available to electrically couple semiconductor package 120 to other devices such as printed circuit boards and/or motherboards. In one embodiment, leadframe 122 is formed of copper and an entirety of leadframe 122 is coated with coating 132 to minimize or eliminate oxidation of the exposed portions of copper leadframe 122. Coating 132 is similar to the coating 32 described above, and includes organic protection coatings, nitrogen-containing hydrocarbon coatings, and/or hydrocarbon coatings.

In one embodiment, lead ends 142 extend from body 130, and coating 132 on lead ends 142 is configured to be removed by a desorption process immediately prior to, or as the leads 126 are soldered to another device. Suitable desorption processes include the thermal desorption at temperatures above 180 degrees Celsius and chemical desorption as described above. In one embodiment, that portion of coating 132 that is encapsulated by body 130 is not removed in the desorption process and does not negatively affect performance of package 120.

Figure 4:
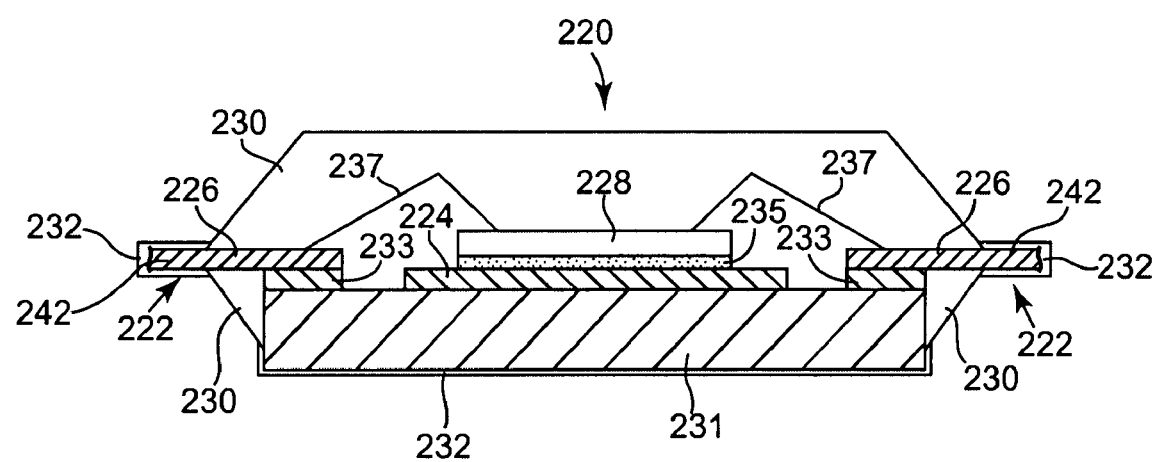
FIG. 4 is a cross-sectional view of a semiconductor package including a hydrocarbon coating disposed on exposed portions of a heatslug and package leads according to one embodiment.

FIG. 4 is a cross-sectional view of a semiconductor package 220 according to one embodiment. Semiconductor package 220 includes a leadframe 222 defining a die pad 224 and leads 226, a chip 228 electrically coupled to die pad 224, a body 230 of encapsulating material deposited around die pad 224 and chip 228, a heatslug 231 physically coupled to die pad 224 opposite chip 228, and an organic coating 232 disposed over at least a portion of leadframe 222 and exposed portions of heatslug 231.

In one embodiment, leadframe 222 is attached to heatslug 231 by a thermally conductive material 233, such as an adhesive, and chip 228 is attached to die pad 224 by a die attach adhesive 235. Chip 228 is electrically coupled to leads 226 by connectors 237. Heat generated by die 228 is conducted to and dissipated by heatslug 231.

Coating 232 is similar to the coating 32 described above, and includes organic protection coatings, nitrogen-containing hydrocarbon coatings, and/or hydrocarbon coatings. In one embodiment, organic coating 232 is disposed over an entirety of leadframe 222, including die pad 224 and leads 226 and an entirety of heatslug 231 by spraying or dipping to achieve an all-encompassing protection layer similar to that illustrated in FIG. 3 above.

In one embodiment, organic coating 232 is disposed over exposed lead ends 242 of leads 226 and over the exposed portions of heatslug 231. For example, organic coating 232 is sprayed or dipped on the exposed lead ends 242 and the exposed portions of heatslug 231 after semiconductor package 220 is fabricated. As noted above, the organic coating 232 has an affinity or adhesion to copper and alloys of copper such that the exposed lead ends 242 and exposed copper portions of heatslug 231 are preferentially coated when the fabricated semiconductor package 220 is treated with coating 232. In this manner, the copper portions of the finished semiconductor package 220 are protected from undesirable oxidation.

Embodiments described above provide a nitrogen-containing hydrocarbon coating deposited over lead ends of a semiconductor package to prevent oxidation of the copper-containing lead ends. In one embodiment, the hydrocarbon coating is desorbed, removed, or vaporized from the lead ends at temperatures of greater than about 180 degrees Celsius. In one embodiment, hydrocarbon coatings described above have excellent surface adhesion to metals, such as lead ends 42 that are formed from copper or copper alloys. In contrast to other protective coatings, the hydrocarbon coating 32 described above does not include expensive and difficult to handle metal particles and is configured to adhere well to copper and copper-containing lead ends.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific semiconductor package embodiments including leads protected from undesirable oxidation as discussed herein. Therefore, it is intended that this invention be limited only by the claims and the equivalents thereof.

What is claimed is:

1. A semiconductor package comprising:
   a leadframe defining a die pad, a chip electrically coupled to the die pad, encapsulation material covering the chip and the die pad, and a plurality of lead ends extending from the encapsulation material and configured for electrical communication with the chip; and
   a nitrogen-containing hydrocarbon coating disposed over the plurality of lead ends of the leadframe such that no portion of the plurality of lead ends is exposed;
   wherein the hydrocarbon coating is free of metal particles; and
   wherein the hydrocarbon coating is configured to removably vaporize from the lead ends at a temperature of between about 200-300 degrees Celsius.

2. The semiconductor package of claim 1, wherein the hydrocarbon coating is selected from the group consisting of imidazole, imidazole derivatives, benzotriazol, benzotriazol derivatives, amine, amine derivatives, silane, and silane derivatives.

3. The semiconductor package of claim 1, wherein the hydrocarbon coating is disposed over an entirety of the leadframe including the lead ends, the hydrocarbon coating adapted for removal from the lead ends by a desorption process.

4. The semiconductor package of claim 1, wherein the hydrocarbon coating is selected from the group consisting of 4-methylimidazole, 4-methyl-5hydroxymethylimidazole, 1-phenyl-4-methylimidazole, and 1-(p-tolyl)-4-methylimidazole.

5. The semiconductor package of claim 1, wherein the hydrocarbon coating is selected from the group consisting of monoalkylated ethylenediamine, bisalkylated ethylenediamine, isocyanate, nitrile, succinimide, guanidine, stearic acid, and cationic amine.

6. The semiconductor package of claim 1, wherein the hydrocarbon coating is selected from the group consisting of triethoxy(1-phenylethenyl)silane, triethoxy(3-isocyanatopropyl)silane, and (3-aminopropyl)triethoxysilane.

7. An electronic device comprising:
   a die pad, a chip electrically coupled to the die pad, encapsulation material covering the chip and the die pad, and a plurality of leads configured to electrically communicate with the chip, the leads defining lead ends; and
   an organic coating disposed over at least the lead ends;
   wherein the organic coating is free of metal particles and adapted to vaporize from the lead ends at a temperature between about 180-300 degrees Celsius.

8. The electronic device of claim 7, wherein the organic coating comprises a nitrogen-containing hydrocarbon coating.

9. The electronic device of claim 7, wherein the organic coating is configured to removably vaporize from the lead ends at a temperature of between about 200-300 degrees Celsius.

10. The electronic device of claim 7, wherein the organic coating is selected from the group consisting of imidazole, imidazole derivatives, benzotriazol, benzotriazol derivatives, amine, amine derivatives, silane, and silane derivatives.

11. The electronic device of claim 7, further comprising:
    a heatslug coupled to the die pad opposite the chip;
    wherein the organic coating is disposed over the die pad and each of the leads and over exposed portions of the heatslug.

12. An electronic device configured for electrical attachment to a circuit board, the electronic device comprising:
    a leadframe defining a die pad;
    a chip electrically coupled to the die pad;
    a body encapsulating the chip and the die pad; and
    a plurality of leads in electrical communication with the chip, each lead defining a lead end defined as all portions of each lead extending from the body;
    an organic coating deposited on the lead ends such that no portion of the lead ends are exposed; and
    a heatslug coupled to the die pad opposite the chip;
    wherein the organic coating comprises a nitrogen-containing hydrocarbon coating disposed over the leadframe, the plurality of leads, and the heatslug, and
    wherein the organic coating is free of metal particles and substantially removable from the lead ends by a desorption process.

13. The electronic device of claim 12, wherein the organic coating is substantially removable from the lead ends by thermal desorption at a temperature above about 180 degrees Celsius.

14. The electronic device of claim 12, wherein the organic coating is substantially removable from the lead ends by thermal desorption at a temperature of between about 200-300 degrees Celsius.

15. The electronic device of claim 12, wherein the organic coating is substantially removable from the lead ends by chemical desorption at a temperature below about 180 degrees Celsius.

16. The electronic device of claim 12, wherein the organic coating is selected from the group consisting of imidazole, imidazole derivatives, benzotriazol, benzotriazol derivatives, amine, amine derivatives, silane, and silane derivatives.

17. A semiconductor package comprising:

a leadframe defining a die pad, a chip electrically coupled to the die pad, encapsulation material covering the chip and the die pad, and a plurality of lead ends exposed relative to the encapsulation material and configured for electrical communication with the chip; and a nitrogen-containing hydrocarbon coating disposed over at least the lead ends of the leadframe;

wherein the hydrocarbon coating is free of metal particles, and wherein the hydrocarbon coating is configured to removably vaporize from the lead ends at a temperature of between about 200-300 degrees Celsius.

18. The semiconductor package of claim 17, wherein the hydrocarbon coating is disposed over an entirety of the leadframe including the lead ends.

19. An electronic device comprising:

a die pad, a chip electrically coupled to the die pad, encapsulation material covering the chip and the die pad, and a plurality of leads configured to electrically communicate with the chip, the leads defining lead ends;

an organic coating disposed over at least the lead ends; and a heatslug coupled to the die pad opposite the chip;

wherein the organic coating is disposed over the die pad and each of the leads and over exposed portions of the heatslug, and wherein the organic coating is free of metal particles and adapted to vaporize from the lead ends at temperatures greater than 180 degrees Celsius.

20. The electronic device of claim 19, wherein the organic coating comprises a nitrogen-containing hydrocarbon coating.

21. The electronic device of claim 19, wherein the organic coating is configured to removably vaporize from the lead ends at a temperature of between about 200-300 degrees Celsius.

22. The electronic device of claim 19, wherein the organic coating is selected from the group consisting of imidazole, imidazole derivatives, benzotriazol, benzotriazol derivatives, amine, amine derivatives, silane, and silane derivatives.

* * * * *